(12) United States Patent
Elsherbini et al.

(10) Patent No.: US 9,647,636 B1
(45) Date of Patent: May 9, 2017

(54) PIEZOELECTRIC PACKAGE-INTEGRATED DELAY LINES FOR RADIO FREQUENCY IDENTIFICATION TAGS

(71) Applicant: Intel Corporation, Santa Clara, CA (US)

(72) Inventors: Adel A. Elsherbini, Chandler, AZ (US); Telesphor Kamgaing, Chandler, AZ (US); Feras Eid, Chandler, AZ (US); Vijay K. Nair, Mesa, AZ (US); Georgios C. Dogiamis, Gilbert, AZ (US); Johanna M. Swan, Scottsdale, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/088,825

(22) Filed: Apr. 1, 2016

(51) Int. Cl.
| | |
|---|---|
| *G06K 19/06* | (2006.01) |
| *H03H 9/30* | (2006.01) |
| *H03H 9/205* | (2006.01) |
| *H03H 9/17* | (2006.01) |
| *G06K 7/10* | (2006.01) |

(52) U.S. Cl.
CPC .......... *H03H 9/30* (2013.01); *G06K 7/10316* (2013.01); *H03H 9/17* (2013.01); *H03H 9/205* (2013.01)

(58) Field of Classification Search
CPC ...................... G06K 19/0675; G06K 19/0672

USPC ......................................................... 235/492
See application file for complete search history.

(56) References Cited

U.S. PATENT DOCUMENTS

| | | | |
|---|---|---|---|
| 6,827,281 B2* | 12/2004 | Edmonson et al. ................. | G06K 19/0672 235/492 |
| 7,407,111 B2* | 8/2008 | Hartmann ............ | H03H 9/6406 235/375 |
| 2004/0075560 A1* | 4/2004 | Hartmann et al. . | G08B 13/2417 340/572.1 |
| 2014/0239628 A1* | 8/2014 | MacPherson et al. . | B82Y 20/00 283/67 |

* cited by examiner

*Primary Examiner* — Seung Lee
(74) *Attorney, Agent, or Firm* — Blakely, Sokoloff, Taylor & Zafman LLP (57) ABSTRACT

Embodiments of the invention include delay line circuitry that is integrated with an organic substrate. Organic dielectric material and a plurality of conductive layers form the organic substrate. The delay line circuitry includes a piezoelectric transducer to receive a guided electromagnetic wave signal and to generate an acoustic wave signal to be transmitted with an acoustic transmission medium. An acoustic reflector is communicatively coupled to the acoustic transmission medium. The acoustic reflector receives a plurality of acoustic wave signals from the acoustic transmission medium and reflects acoustic wave signals to the piezoelectric transducer using the acoustic transmission medium. The transducer converts the reflected acoustic signals into electromagnetic waves which are then transmitted back through the antenna and decoded by the reader.

26 Claims, 8 Drawing Sheets

PIEZOELECTRIC PACKAGE-INTEGRATED DELAY LINES FOR RADIO FREQUENCY IDENTIFICATION TAGS

FIELD OF THE INVENTION

Embodiments of the present invention relate generally to semiconductor package integrated devices. In particular, embodiments of the present invention relate to piezoelectric semiconductor package integrated delay lines for radio frequency identification (RFID) tags.

BACKGROUND OF THE INVENTION

RFID uses electromagnetic fields to automatically identify and track tags attached to objects. The tags contain electronically stored information. RFID tags are used in many applications such as security cards, inventory control and storing small amounts of information. In their simplest form, passive RFID tags consist of an antenna connected to an integrated circuit (IC). The reader is an external device that transmits radio waves towards the RFID tag and measures the backscattered wave amplitude versus time. The antenna transfers the incident radio waves to the IC which modulates the impedance seen by the antenna versus time according to the stored data. When the impedance seen by the antenna is close to its input impedance (e.g., 50 Ohms), the backscattered wave amplitude is very low. On the other hand, when the impedance seen by the antenna is close to zero (short circuit) or very high (open circuit) the backscattered wave amplitude is high. The reader detects this amplitude and uses it to determine the stored information or the tag number of the IC.

RFID ICs are fabricated using silicon technology and require additional packaging and assembly to attach to the antenna. This results in higher cost and limits the use of RFIDs to relatively higher cost systems. An alternative is connecting the antenna to multiple length transmission lines which provide multiple delays corresponding to the stored data inside the RFID. Unfortunately, due to the very fast propagation speeds of radio waves, very long transmission lines such as hundreds of meters are needed to achieve significant delays that are easy to detect which results in a very large or expensive system.

Typical delay lines are implemented using discrete components or electrical transmission lines, which results in a relatively large circuit if the delays required are long.

DETAILED DESCRIPTION OF THE INVENTION

Described herein are semiconductor package-integrated piezoelectric delay lines for RFID tags. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The fundamental reason for large delay circuitry of prior approaches is that electromagnetic propagation speed in a transmission line is close to or equal to the speed of light in the transmission line medium and the delay that can be achieved is proportional to the transmission line length divided by the speed of light in the medium. This requires relatively long transmission lines for longer delays due to the very fast speed of light.

The present design addresses the fabrication of delay line circuitry for RFID tags within the semiconductor package substrate that is compatible with high volume package substrate fabrication technology. This present design for delay line circuitry integrated in a package substrate is based on our ability to deposit piezoelectric materials in the package substrate and create cavities near the piezoelectric transducers in the substrate.

In one embodiment, this technology allows using electric to acoustic transducers in the package substrate which is coupled to the PCB to convert the electric signals into acoustic waves which are then transmitted through an acoustic transmission line or an acoustic network. Acoustic waves travel at much slower velocities than electromagnetic waves, thus allowing significant size and area reduction to achieve relatively long delays. The present design results in package-integrated delay lines, thus enabling smaller and thinner systems for RFID tags in comparison to discrete components attached to a substrate or board or electrical transmission lines. The package-integrated RFIDs do not add a Z height (along the vertical axis) to a total height of a substrate or multiple substrates. This present design can be manufactured as part of the substrate fabrication process with no need for purchasing and assembling discrete components. It therefore enables high volume manufacturability (and thus lower costs) of systems that need RFIDs.

The present design has significantly lower cost compared to discrete RFID ICs especially when other acoustic structures are also needed inside the package (e.g., filters or resonators). Furthermore, the present design enables integrating RFIDs inside the packages before assembly which can enable substrate inventory tracking at early manufacturing stages (even before the substrates have been singulated and assembled). The present design provides a convenient and fast method of tracking package substrates from substrate manufacturing through assembly until reaching a final microelectronic device product.

In one example, the present design includes package-integrated structures to act as acoustic delay lines for RFID tags. Those structures are manufactured as part of the package layers and include cavities by removing the dielectric material around them. The structures include transducers having piezoelectric stacks that are deposited and patterned layer-by-layer into the package. The present design includes creating functional transducers in the package. Etching of the dielectric material in the package occurs to create cavities. Piezoelectric material deposition (e.g., 0.5 to 1 um deposition thickness) and crystallization also occurs in the package substrate during the package fabrication process. An annealing operation at a lower substrate temperature range (e.g., up to 260° C.) allows crystallization of the piezoelectric material (e.g., lead zirconate titanate (PZT), potassium sodium niobate (KNN), aluminum nitride (AlN), zinc oxide (ZnO), etc) to occur during the package fabrication process. In one example, laser pulsed annealing occurs locally with respect to the piezoelectric material for the annealing operation without damaging other layers of the package substrate (e.g., organic substrate).

The basic principle of the present design includes converting the electromagnetic energy from the reader into acoustic waves using a package-integrated piezoelectric transducer. Acoustic waves have much slower propagation speeds than electromagnetic waves and thus large delays can be achieved using much shorter and more compact transmission lines. The piezoelectric transducer can be integrated with the package/board using high volume manufacturing technology.

Figure 1A:
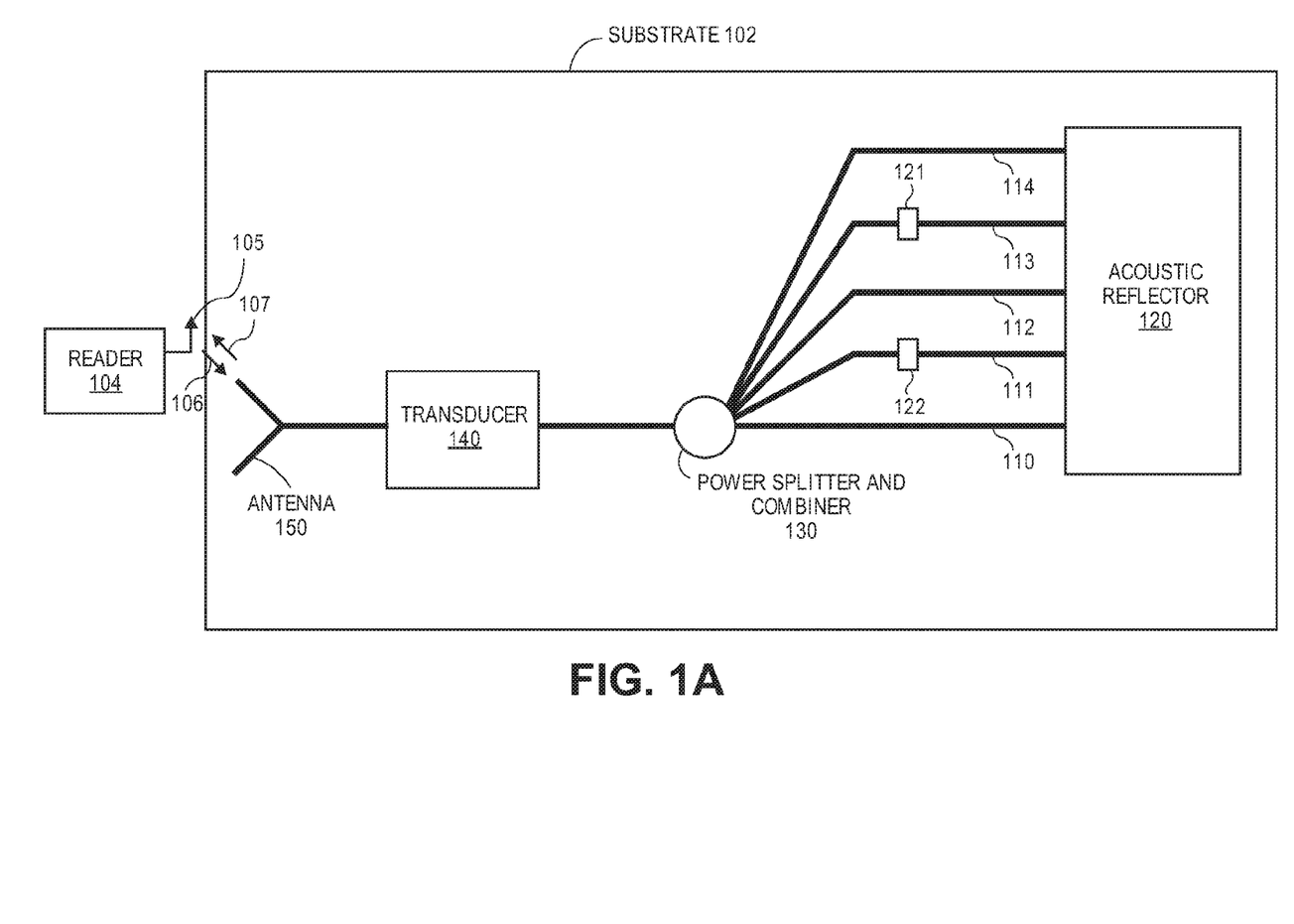
FIG. 1A illustrates a delay line circuit for RFID tags having a piezoelectric transducer integrated in an organic substrate (e.g., package substrate, PCB) in accordance with one embodiment.

FIG. 1A illustrates a delay line circuit for RFID tags having a piezoelectric transducer integrated in an organic substrate (e.g., package substrate, PCB) in accordance with one embodiment. An organic substrate 102 (e.g., delay line circuit integrated in organic substrate 102) includes an antenna 150 that receives electromagnetic waves 106 from an antenna 105 of a reader 104 for a RFID tag embodiment. The transducer 140 converts the electromagnetic waves into acoustic waves. A power splitter and combiner unit 130 carries out two functions as explained in the following. The splitter portion of unit 130 splits the power of the incoming acoustic waves from the transducer 140 between n different length acoustic transmission lines (e.g., 5 different length acoustic transmission lines 110-114, any number of different length acoustic transmission lines). The acoustic reflector 120 reflects the acoustic waves back and the combiner portion of unit 130 recombines them and retransmits them to the transducer 140 which converts them back into electromagnetic waves 107 that get transmitted through the antenna 150 and are read by the reader 104. By cutting or disconnecting some of the transmission lines (e.g., lines 111 and 113) at locations 122 and 121, different bit patterns corresponding to each tag can be generated. In the example in FIG. 1A, the backscattered wave 107 from the acoustic transducer 140 will have peaks at delay values corresponding to 2* the one way delay across transmission line 110 (D110), 2*the one way delay across transmission line 112 (D112), and 2*the one way delay across transmission line 114 (D114). Dn is the one way delay through each transmission line and can be calculated by a length of a transmission line divided by an acoustic wave velocity in the respective transmission line. The cuts at locations 121 and 122 in the acoustic transmission lines can be patterned using lithography or laser ablation. The reader can detect the amplitudes of reflections versus time and correlate it to the code stored in the acoustic structure.

The delay line circuit formed in organic substrate 102 includes the transducer 140, power splitter and combiner 130, delay lines 110-114, and acoustic reflector 120. The antenna 150 is electrically coupled to the transducer 140. The antenna 150 may be located in a separate device, substrate, or component with respect to the organic substrate or the antenna 150 may be integrated with the organic substrate.

In FIG. 1A, the power splitting and recombination occurs in an acoustic domain. Alternatively, the power splitting and recombination may occur in an electric domain as illustrated in FIG. 1B.

Figure 1B:
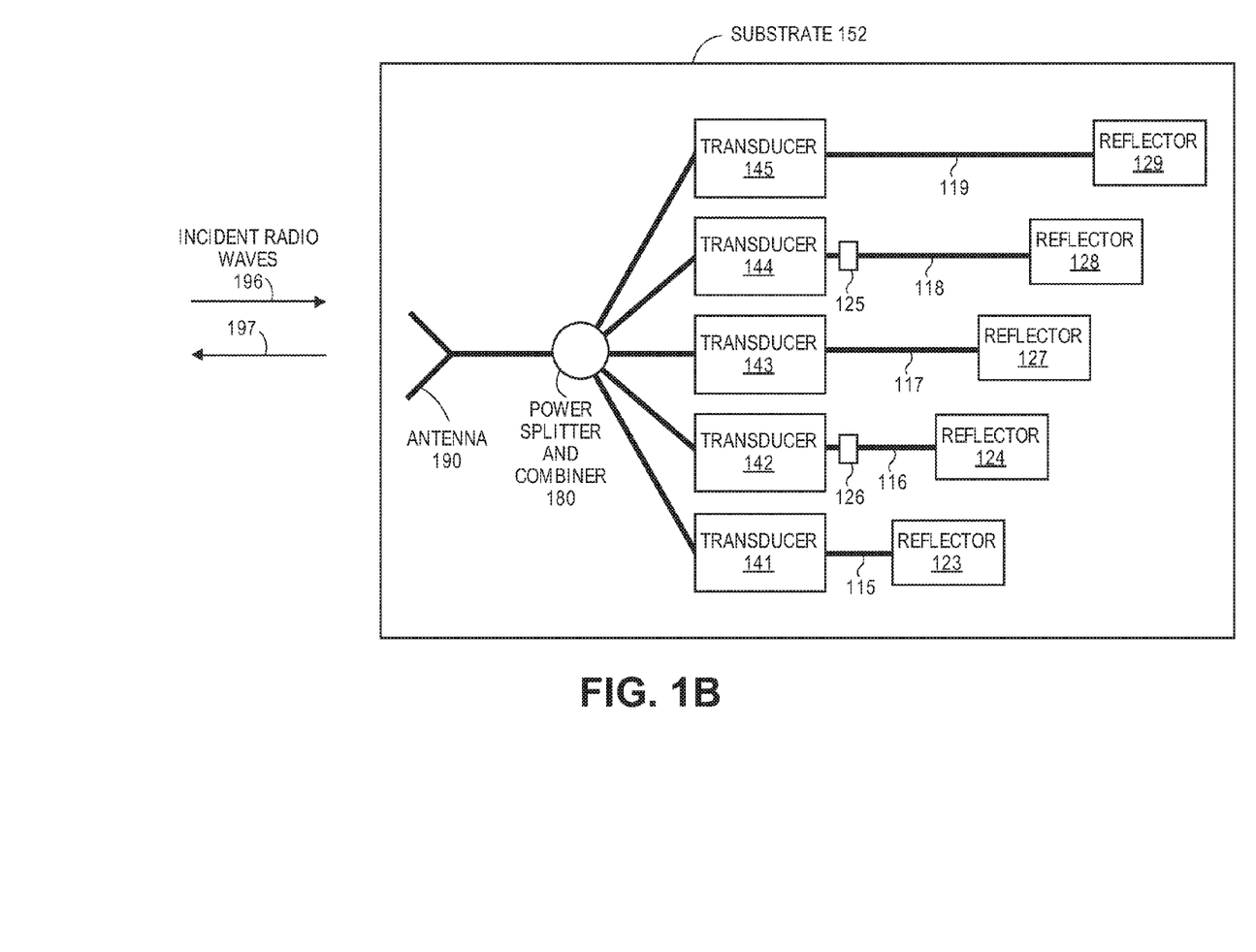
FIG. 1B illustrates a delay line circuit for RFID tags having multiple piezoelectric transducers integrated in an organic substrate (e.g., package substrate, PCB) in accordance with one embodiment.

FIG. 1B illustrates a delay line circuit for RFID tags having multiple piezoelectric transducers integrated in an organic substrate (e.g., package substrate, PCB) in accordance with one embodiment. An organic substrate 152 (e.g., delay line circuit integrated in organic substrate 152) includes an antenna 190 that receives electromagnetic waves 196 from an antenna of an external reader for a RFID tag embodiment. A power splitter and combiner unit 180 receives the electromagnetic waves from the antenna and its splitter portion splits the power of the electromagnetic waves between the transducers 141-145. The transducers convert the electromagnetic waves into respective acoustic waves which are transmitted between n different length acoustic transmission lines (e.g., 5 different length acoustic transmission lines 115-119, any number of different length acoustic transmission lines). The acoustic reflectors (e.g., anchors) 123, 124, 127-129 reflect the respective acoustic waves back across the acoustic transmission lines to the transducers. The transducers then convert the respective received acoustic waves into electromagnetic waves to be transmitted to the power splitter and combiner unit 180 whose combiner portion recombines the electromagnetic waves and retransmits them through the antenna 190 as electromagnetic waves 197 to be read by the reader.

By cutting or disconnecting some of the transmission lines (e.g., lines 116 and 118) at locations 126 and 125, different bit patterns corresponding to each tag can be generated. In the example in FIG. 1B, the backscattered wave 197 from the acoustic transducers will have peaks at delay values corresponding to 2* the one way delay across transmission line 115 (D115), 2*the one way delay across transmission line 117 (D117), and 2*the one way delay across transmission line 119 (D119). Dn is the one way delay through each transmission line and can be calculated by a length of a transmission line divided by an acoustic wave velocity in the respective transmission line. The cuts at locations 125 and 126 in the acoustic transmission lines can be patterned using lithography or laser ablation.

The organic substrate of the circuit 152 includes the transducers, delay lines, and acoustic reflectors. The antenna 190 is electrically coupled to the power combiner and splitter 180 and the transducers. The antenna 190 and power combiner and splitter 180 may be located in a separate device, substrate, or component with respect to the organic substrate or may be integrated with the organic substrate.

Figure 2:
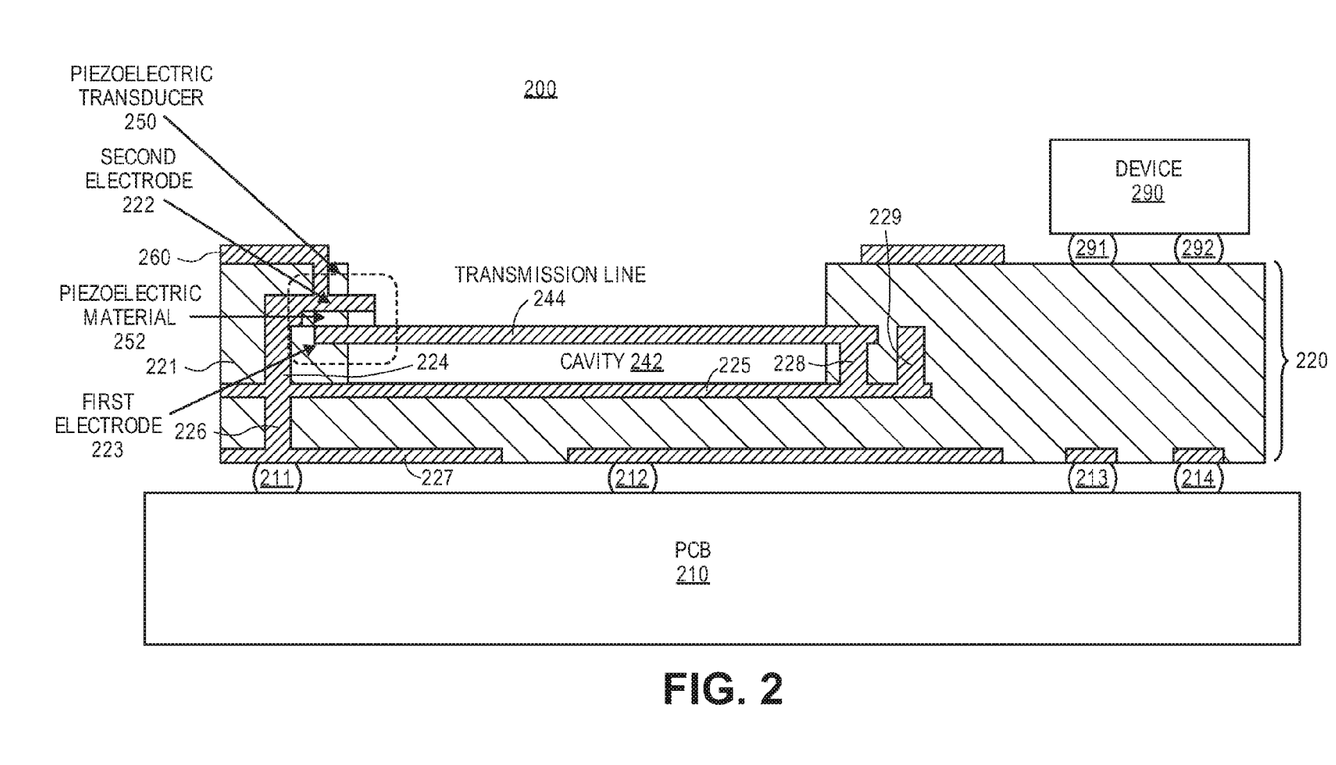
FIG. 2 illustrates a view of a microelectronic device 200 having package-integrated piezoelectric reflect type delay line, according to an embodiment of the invention.

Referring now to FIG. 2, a view of a microelectronic device 200 having package-integrated piezoelectric reflect type delay line is shown, according to an embodiment of the invention. In one example, the microelectronic device 200 includes a device 290 (e.g., die, chip, CPU, silicon die or chip, RF transceiver, etc.) that is coupled or attached to a package or organic substrate 220 with solder balls 291 and 292. One or more additional devices can also be coupled to the package substrate 220. The package substrate 220 may optionally be coupled or attached to a printed circuit board (PCB) 210 using for example solder balls 211-214.

The package substrate 220 (e.g., organic substrate) includes organic dielectric layers 221 and conductive layers 222-229 and 260 (e.g., copper layers, vias, thru connections, mechanical anchors, etc.). The conductive layers 224, 228, and 260 are electrically coupled to a transducer 250. In one example, an antenna unit 260 receives electromagnetic waves from an RFID reader. The transducer 250 receives the electromagnetic waves from the antenna unit 260 and converts the electromagnetic waves into acoustic waves which propagate from a first end of an acoustic transmission line 244 (e.g., suspended beam), which is located in proximity to the transducer 250, until being reflected at a second end of the line 244 based on acoustic reflectors (e.g., mechanical anchors 228 and 229). The reflected acoustic waves propagate back to the transducer 250 which converts the acoustic waves back into electromagnetic waves that get retransmitted through the antenna unit 260 and are read by the reader.

Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 220 can be formed during package substrate processing (e.g., panel level). The panels formed can be large (e.g., having in-plane dimensions approximately 0.5 meter by 0.5 meter or greater, etc.) for lower cost. A cavity 242 is formed within the package substrate 220 by removing one or more layers (e.g., organic layers, organic dielectric layers, etc.) from the package substrate 220. In one example, the piezoelectric transducer 250 is formed with a first conductive layer (first electrode 223), a piezoelectric material 252 disposed on the first conductive layer, and a second conductive layer (second electrode 222) disposed on the piezoelectric material. The conductive layers and piezoelectric material form a stack. The first conductive layer can act as a first electrode and the second conductive layer can act as a second electrode of the piezoelectric device or another electrode can be patterned to act as the second electrode of the device. The cavity 242 can be air-filled or vacuum-filled. The transducer is coupled to the acoustic transmission delay line 244 (e.g., solid conductive layer, mesh conductive layer, etc.). In another example, the transducer 250, line 244, and reflectors 228 and 229 are implemented within a cavity of a PCB rather than within a package substrate 220.

Figure 5:
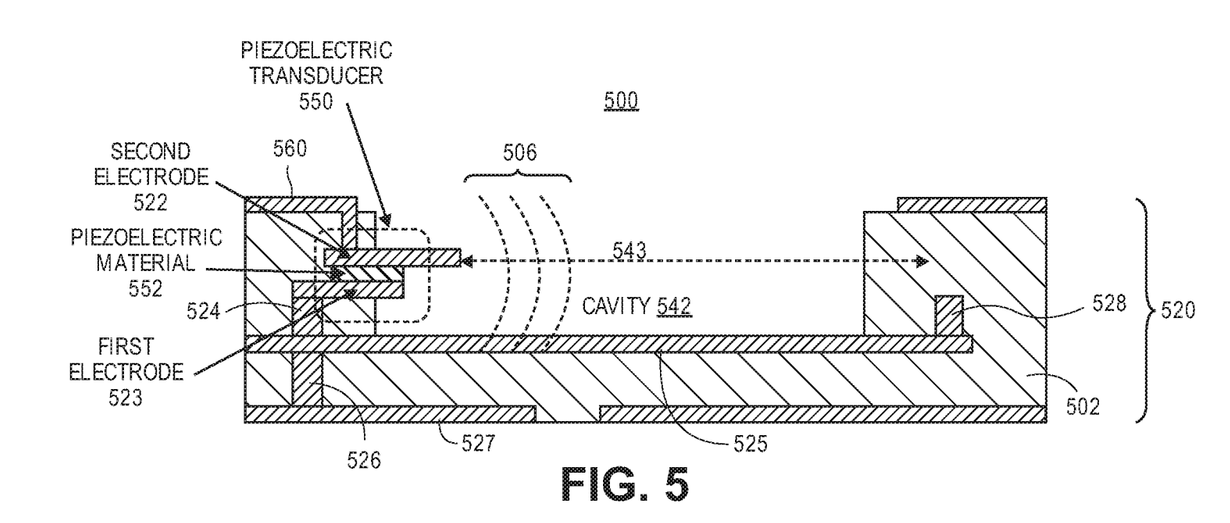
FIG. 5 illustrates a view of a waveguide structure 500 having package-integrated piezoelectric reflect type delay line with an air medium for wave transmission, according to an embodiment of the invention.

The pressure (or acoustic) waves propagate through the delay line at a speed that depends on the material properties of the delay line (e.g., copper, build-up Film (BF) or composite) and on the mode of wave propagation across the delay line (e.g., transverse wave, longitudinal wave etc.). In one example, the transducer 250 can be implemented by depositing and patterning piezoelectric materials (e.g., lead zirconate titanate (PZT), potassium sodium niobate (KNN), zinc oxide (ZnO), or other materials) in the package substrate (or PCB) sandwiched between conductive electrodes as shown in FIGS. 2 and 5. Copper or other conductive material can be used for the electrodes. The delay line itself can consist of a copper trace such as a straight or bent/meandered beam or plate. Organic dielectric normally surrounds copper traces in packages/PCBs; however this organic material is removed around the transducer and delay line in FIG. 2 to allow electrical to acoustic transduction and vice versa. When the piezoelectric layer receives an electrical signal across its electrodes, a mechanical deformation is induced, generating an acoustic wave that travels across the acoustic delay line. This acoustic wave propagates towards the mechanical anchor. The mechanical anchor reflects the wave back towards the transducer, which converts it back to an electrical signal due to the resulting deformation in the piezoelectric layer. This electrical signal is delayed according to the propagation speed and the length of the beam, plate, or medium used as the delay line.

Figure 3:
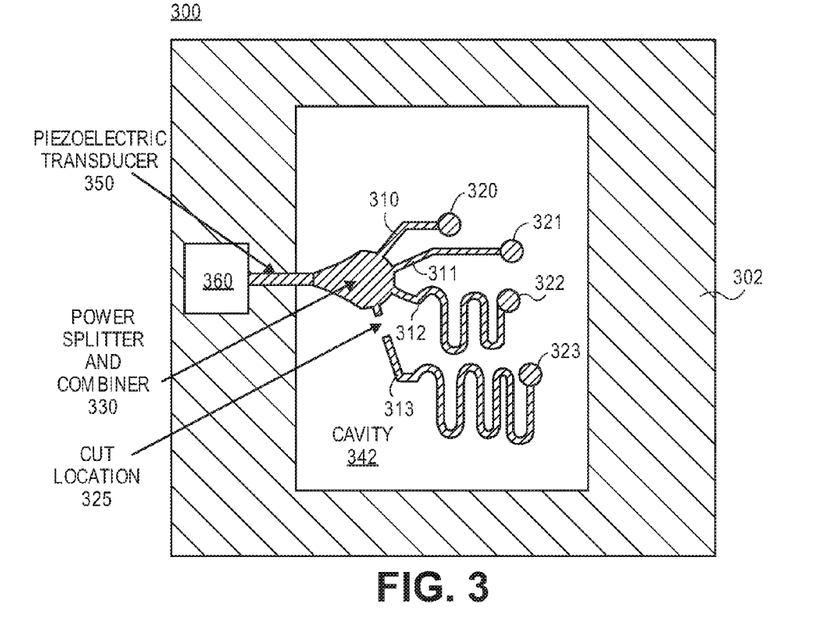
FIG. 3 illustrates a top view of a package-integrated piezoelectric reflect type delay line structure having delay lines implemented with conductive structures for wave transmission in accordance with one embodiment.

FIG. 3 illustrates a top view of a package-integrated piezoelectric reflect type delay line structure having delay lines implemented with conductive structures for wave transmission in accordance with one embodiment. The structure 300 of an organic substrate includes organic material with one or more dielectric layers 302, a cavity 342, and a transducer 350. The transducer 350 includes first and second electrodes and a piezoelectric material 352.

An antenna 360 receives electromagnetic waves from an external reader for a RFID tag embodiment. The transducer 350 converts the electromagnetic waves into acoustic waves. A power splitter and combiner 330 receives the acoustic waves from the transducer and splits the power of the acoustic waves between n different length acoustic transmission lines (e.g., 4 different length acoustic lines 310-313, any number of different length acoustic transmission lines). The acoustic reflectors 320-323 (e.g., mechanical anchors, vias, etc.) reflect the acoustic waves back and the power splitter and combiner 330 recombines them and retransmits them to the transducer 350 which converts them back into electromagnetic waves that get retransmitted through the antenna 360 and are read by the reader. By cutting some of the transmission lines (e.g., 313) at location 325, different bit patterns corresponding to each tag can be generated. In the example in FIG. 3, the backscattered wave from the acoustic transducer 350 will have peaks at delay values corresponding to 2* the one way delay across transmission line 310 (D310), 2*the one way delay across transmission line 311 (D311), and 2*the one way delay across transmission line 312 (D312). Dn is the one way delay through each transmission line n and can be calculated by a length of a transmission line divided by the acoustic wave velocity in the respective transmission line. The cut at location 325 in the acoustic transmission line 313 can be patterned using lithography or laser ablation.

Figure 4:
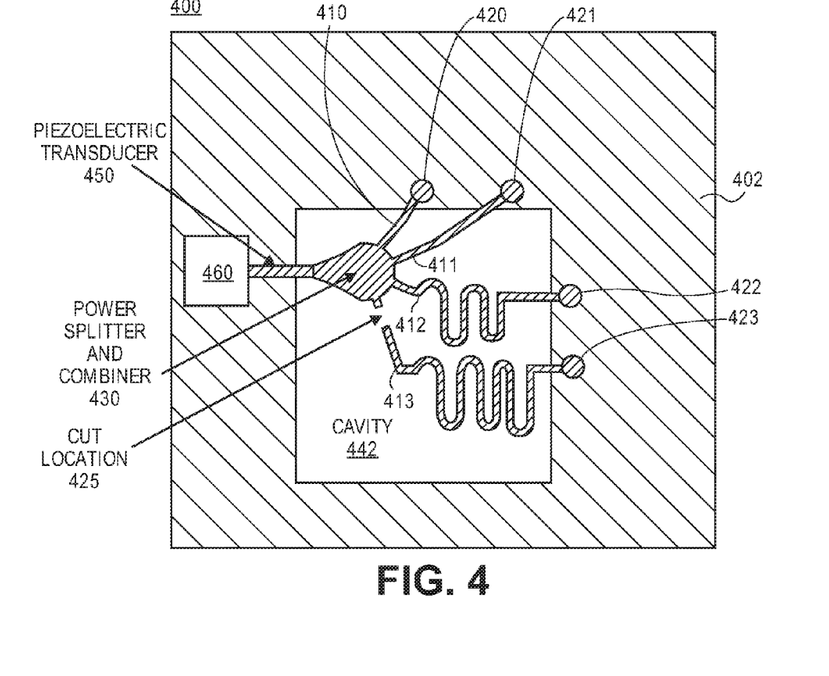
FIG. 4 illustrates a top view of a package-integrated piezoelectric reflect type delay line structure having delay lines implemented with conductive structures for wave transmission in accordance with one embodiment.

In FIG. 3, the reflectors are positioned within the cavity 342. The delay lines can be meandered to achieve a certain length while reducing the overall form factor (e.g., area) of a structure 300. In FIG. 4, the reflectors are positioned within the organic material outside of a cavity. The positioning of the reflectors depends on the different transmission line lengths required for a particular design.

FIG. 4 illustrates a top view of a package-integrated piezoelectric reflect type delay line structure having delay lines implemented with conductive structures for wave transmission in accordance with one embodiment. The structure 400 of an organic substrate includes organic material with one or more dielectric layers 402, a cavity 442, and a transducer 450. The transducer 450 includes first and second electrodes and a piezoelectric material 452.

An antenna 460 receives electromagnetic waves from an external reader for a RFID tag embodiment. The transducer 450 converts the electromagnetic waves into acoustic waves. A power splitter and combiner unit 430 receives the acoustic waves from the transducer and splits the power of the acoustic waves between n different length acoustic transmission lines (e.g., 4 different length acoustic lines 410-413, any number of different length acoustic transmission lines). The acoustic reflectors 420-423 (e.g., mechanical anchors, vias, etc.) reflect the acoustic waves back and the power splitter and combiner unit 430 recombines them and retransmits them to the transducer 450 which converts them back into electromagnetic waves that get retransmitted through the antenna 460 and are read by the reader. By cutting some of the transmission lines (e.g., 413) at location 425, different bit patterns corresponding to each tag can be generated. In the example in FIG. 4, the backscattered wave from the acoustic transducer 450 will have peaks at delay values corresponding to 2* the one way delay across transmission line 410 (D410), 2*the one way delay across transmission line 411 (D411), and 2*the one way delay across transmission line 412 (D412). Dn is the one way delay through each transmission line n and can be calculated by a length of a transmission line divided by an acoustic wave velocity in the respective transmission line. The cut at location 425 in the acoustic transmission line 413 can be patterned using lithography or laser ablation.

Referring now to FIG. 5, a view of a waveguide structure 500 having package-integrated piezoelectric reflect type delay line with an air medium for wave transmission is shown, according to an embodiment of the invention. In one example, the waveguide structure 500 includes organic material integrated with a package substrate 520. The package substrate may optionally be coupled or attached to a printed circuit board (PCB) using for example solder balls.

The waveguide structure of an organic substrate includes organic dielectric layers 502 and conductive layers 522-528 and 560 (e.g., copper layers, vias, thru connections, mechanical anchors, etc.). The conductive layers 524 and 560 are electrically coupled to a transducer 550. In one example, an antenna unit 560 receives electromagnetic waves from an RFID reader. The transducer 550 receives the electromagnetic waves from the antenna unit 560 and converts the electromagnetic waves into acoustic waves which propagate from a first end of an acoustic transmission line 543 (e.g., air medium, dielectric medium), which is located in proximity to the transducer 550, until being reflected at a second end of the line 543 based on acoustic reflectors (e.g., mechanical anchors 528). The reflected acoustic waves propagate back to the transducer 550 which converts the acoustic waves back into electromagnetic waves that get retransmitted through the antenna unit 560 and are read by the reader.

Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 520 can be formed during package substrate processing (e.g., panel level). The panels formed can be large (e.g., having in-plane dimensions approximately 0.5 meter by 0.5 meter or greater, etc.) for lower cost. A cavity 542 is formed within the package substrate 520 by removing one or more layers (e.g., organic layers, organic dielectric layers, etc.) from the package substrate 520. In one example, the piezoelectric transducer 550 is formed with a first conductive layer (first electrode 523), a piezoelectric material 552 disposed on the first conductive layer, and a second conductive layer (second electrode 522) disposed on the piezoelectric material. The conductive layers and piezoelectric material form a stack. The first conductive layer can act as a first electrode and the second conductive layer can act as a second electrode of the piezoelectric device or another electrode can be patterned to act as the second electrode of the device. The cavity 542 can be air-filled or vacuum-filled. The transducer is coupled to the acoustic transmission delay line 543 (e.g., air medium, dielectric medium, etc.). In another example, the transducer 550, line 543, and reflectors 528 are implemented within a cavity of a PCB rather than within a package substrate.

Figure 6:
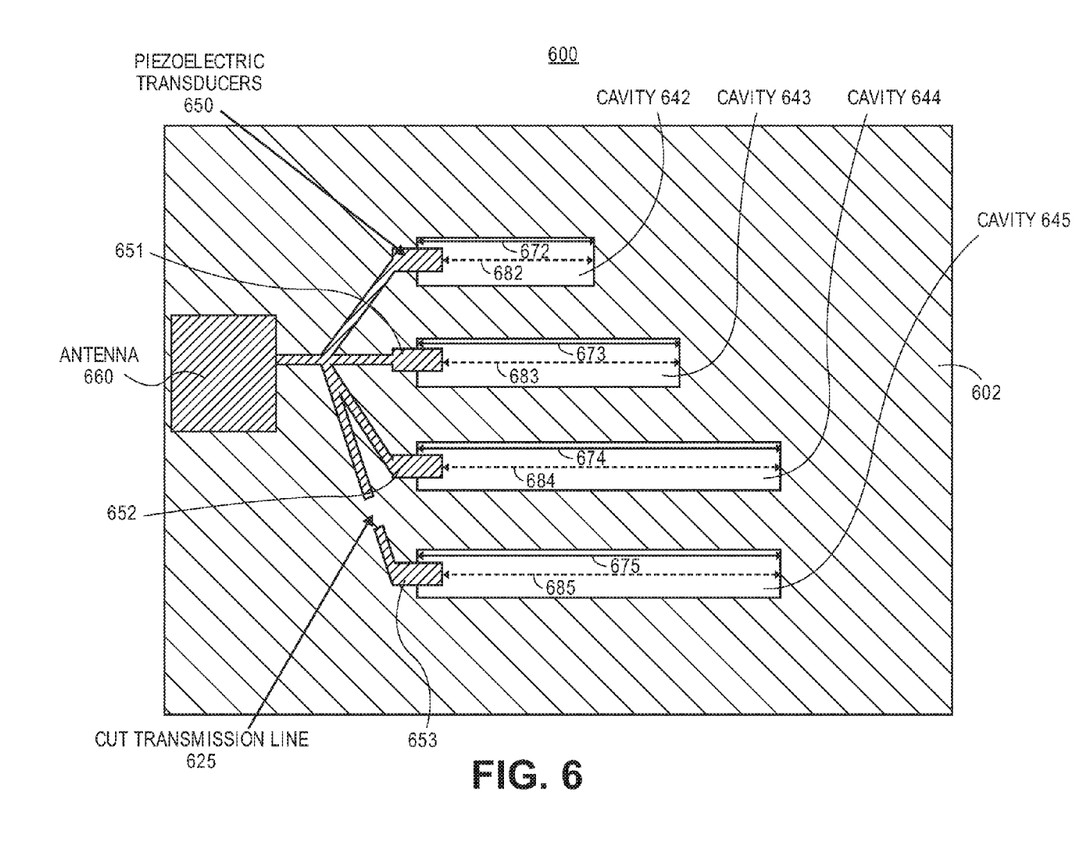
FIG. 6 illustrates a top view of a waveguide structure 600 having package-integrated piezoelectric reflect type delay lines with air mediums for wave transmission, according to an embodiment of the invention.

Referring now to FIG. 6, a top view of a waveguide structure 600 having package-integrated piezoelectric reflect type delay lines with air mediums for wave transmission is shown, according to an embodiment of the invention. In one example, the waveguide structure 600 includes organic material integrated with a package substrate. The package substrate may optionally be coupled or attached to a printed circuit board (PCB) using for example solder balls.

In one example, an antenna unit 660 receives electromagnetic waves from an RFID reader. The transducers 650-653 receive the electromagnetic waves from the antenna unit 660 and convert the electromagnetic waves into acoustic waves which propagate from a first end of acoustic transmission lines 682-685 (e.g., air medium) of respective cavities 642-645, which are located in proximity to the transducers, until being reflected at a second end of the lines based on acoustic reflectors (e.g., air-dielectric material interface). The reflected acoustic waves propagate back to the transducers which convert the acoustic waves back into electromagnetic waves that get retransmitted through the antenna unit 660 and are read by the reader.

Figure 7:
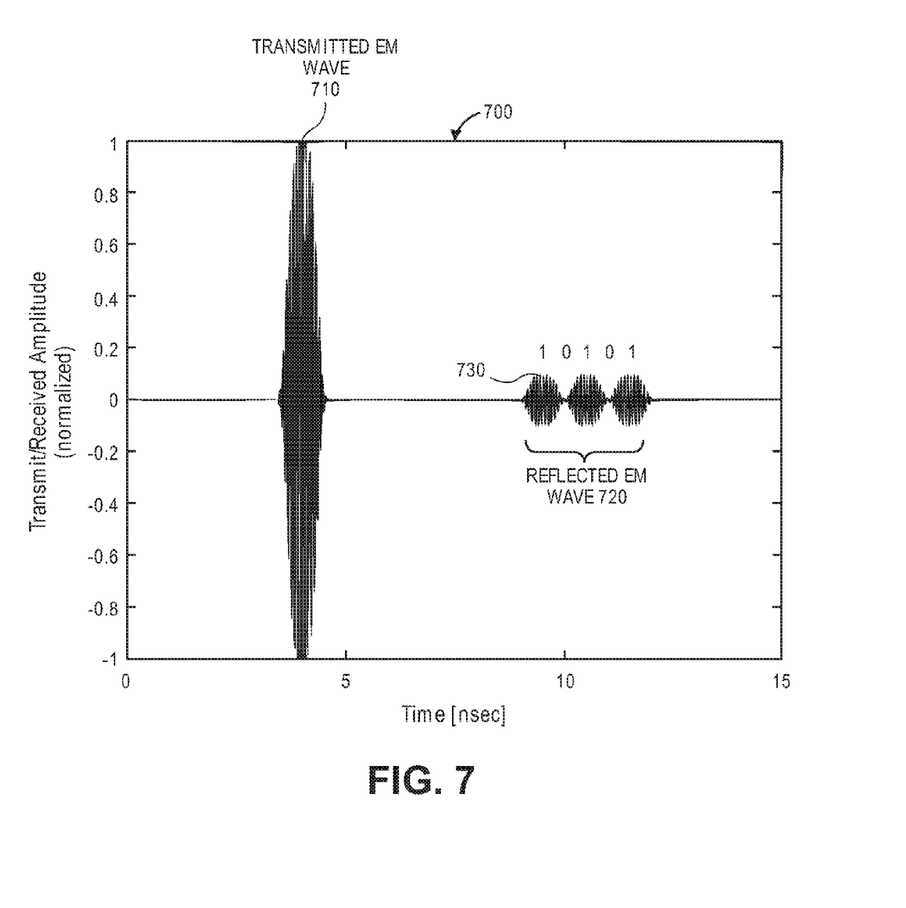
FIG. 7 illustrates a sample pattern for a RFID tag in accordance with one embodiment.

A size of a delay line structure depends on the speed of sound and the required bit rate for an RFID tag. For example, the resulting received pattern (e.g., sample for 6 bit tag encoded with 110101 bit pattern) for a 1 Mbit/s bit rate (e.g., approximately 0.5 MHz bandwidth) for a 13.5 MHz tag is shown in FIG. 7 in accordance with one embodiment. The graph 700 illustrates a transmit/received amplitude (normalized) of acoustic waves on a vertical axis versus time in nanoseconds on a horizontal axis. In one example, a structure includes three connected acoustic transmission lines with 3 mm distance difference between the shortest and longest acoustic transmission lines. An acoustic wave 710 is generated from a transducer of an organic substrate to delay lines upon receiving an electromagnetic wave from an external reader through the antenna. The acoustic wave 710 includes 1 bit of information (e.g., 1). A reflected acoustic wave includes 5 bits of information (e.g., 10101) that can be changed depending on which lines are connected. In one example, for each bit, the logic 1 values occur when the transmission line with the corresponding delay is connected whereas the logic 0 values occur when the transmission line with the corresponding delay is not connected (e.g., cut). In the figure, the bit period is approximately 1 microsecond. The received amplitude 730 is assumed to be ~10 dB lower than the transmitted amplitude. This will be dependent on the distance between the transmitter and receiver. In FIG. 7, the transmission lines are assumed to be very low loss and thus the bits amplitudes are the same. However, even if the transmission lines are lossy this can easily be corrected using a non-uniform power splitter or by the reader.

More complex information can be stored in the tag in an analog fashion if needed (e.g., remove the reflector and use the ends of the cut transmission lines as reflectors; the data can be stored not only in the connected and unconnected lines but also in the resulting delays in the pulses).

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more delay lines.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 8:
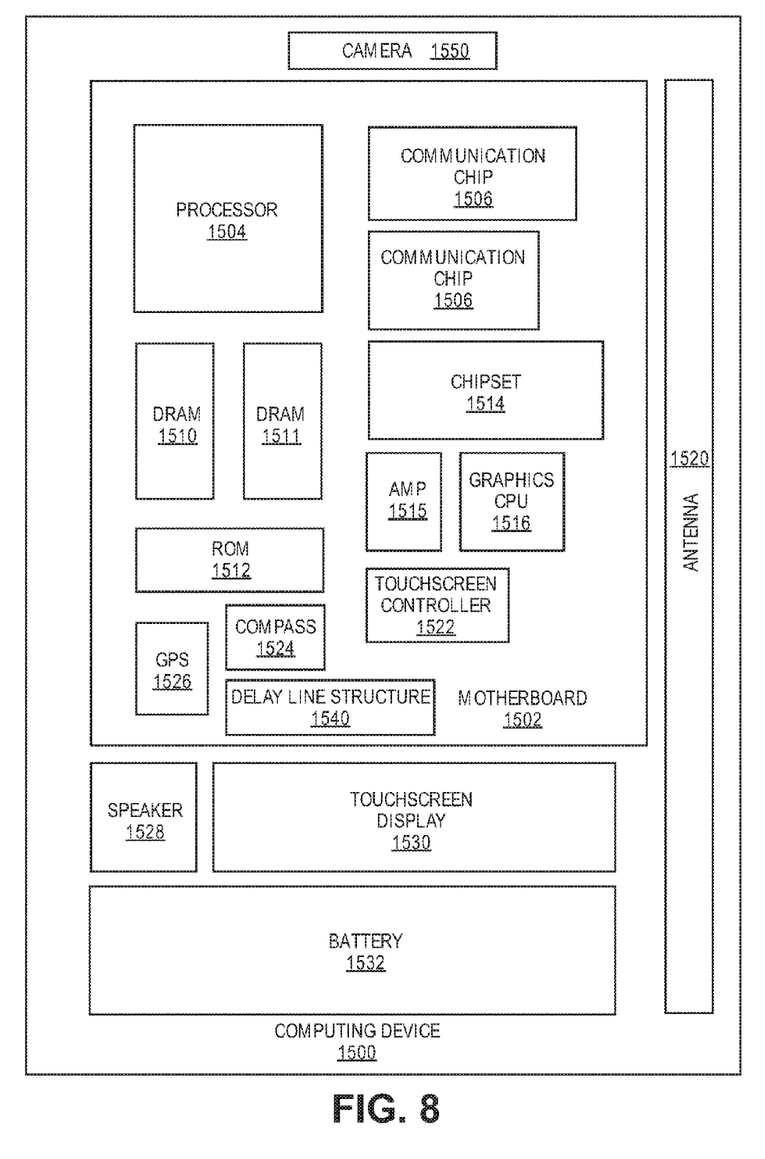
FIG. 8 illustrates a computing device 1500 in accordance with one embodiment of the invention.

FIG. 8 illustrates a computing device 1500 in accordance with one embodiment. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM 1510, 1511), non-volatile memory (e.g., ROM 1512), flash memory, a graphics processor 1516, a digital signal processor, a crypto processor, a chipset 1514, an antenna 1520, a display, a touchscreen display 1530, a touchscreen controller 1522, a battery 1532, an audio codec, a video codec, a power amplifier 1515, a global positioning system (GPS) device 1526, a compass 1524, a package-integrated piezoelectric reflect type delay line structure 1540 (e.g., delay line circuitry for RFID tags), a gyroscope, a speaker, a camera 1550, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi, WiGig and Bluetooth and a second communication chip 1506 may be dedicated to longer range wireless communications such as GPS, EDGE, GPRS, CDMA, WiMAX, LTE, Ev-DO, 5G, and others.

The processor 1504 of the computing device 1500 includes an integrated circuit die packaged within the processor 1504. In some implementations of the invention, the integrated circuit processor package or motherboard 1502 includes one or more devices, such as delay line circuitry in accordance with implementations of embodiments of the invention. The term "processor" may refer to any device or portion of a device that processes electronic data from registers and/or memory to transform that electronic data into other electronic data that may be stored in registers and/or memory. The communication chip 1506 also includes an integrated circuit die packaged within the communication chip 1506.

The following examples pertain to further embodiments. Example 1 is a delay line circuitry integrated with an organic substrate comprising organic dielectric material and a plurality of conductive layers to form the organic substrate, a piezoelectric transducer to receive a guided electromagnetic wave signal and to generate an acoustic wave signal to be transmitted with an acoustic transmission medium, and an acoustic reflector communicatively coupled to the acoustic transmission medium. The acoustic reflector receives a plurality of acoustic wave signals from the acoustic transmission medium and reflects acoustic wave signals to the piezoelectric transducer using the acoustic transmission medium.

In example 2, the subject matter of example 1 can optionally include an antenna unit to receive an electromagnetic wave from a radio frequency identification (RFID) tag reader and to convert this electromagnetic wave into the guided electromagnetic wave signal for a transmission line for propagating to the piezoelectric transducer.

In example 3, the subject matter of any of examples 1-2 can optionally further include a power splitter and combiner coupled to the piezoelectric transducer, the power splitter and combiner to split the acoustic wave signal received from the piezoelectric transducer into multiple acoustic wave signals to be transmitted by a plurality of acoustic transmission lines of the acoustic transmission medium to the acoustic reflector.

In example 4, the subject matter of any of examples 1-3 can optionally further include the power splitter and combiner to combine reflected acoustic wave signals that have been reflected from the acoustic reflector or have been reflected by one or more disconnected acoustic transmission lines.

In example 5, the subject matter of any of examples 1-4 can optionally further include the piezoelectric transducer to receive reflected acoustic wave signals from the power splitter and combiner and to convert the reflected acoustic wave signals into electromagnetic wave signals to be transmitted to the RFID tag reader.

In example 6, the subject matter of any of examples 1-5 can optionally further include the reflected acoustic wave signals representing a code stored in the delay line circuitry with the code being associated with a RFID tag.

In example 7, the subject matter of any of examples 1-6 can optionally further include the piezoelectric transducer comprising a second electrode disposed on a piezoelectric material which is disposed on a first electrode of the piezoelectric transducer.

In example 8, the subject matter of any of examples 1-7 can optionally further include the piezoelectric transducer to generate the acoustic wave signal in response to displacement of the piezoelectric transducer that is caused by the guided electromagnetic wave signals.

In example 9, the subject matter of any of examples 1-8 can optionally further include the organic substrate comprising a cavity having a plurality of acoustic transmission lines each having a different length. The piezoelectric transducer is positioned in proximity to a first end of the cavity and the acoustic reflector is positioned in proximity to a second end of the cavity. The acoustic reflector includes at least one mechanical anchor and the acoustic reflector is positioned within the cavity or within the organic dielectric material.

In example 10, the subject matter of any of examples 1-9 can optionally further include the transmission medium comprising at least one of air and a suspended conductive beam.

In example 11, the subject matter of any of examples 1-10 can optionally further include the organic substrate being fabricated at panel level.

Example 12 is delay line structure comprising organic dielectric material and a plurality of conductive layers to form the delay line structure, a plurality of piezoelectric transducers to receive a plurality of guided electromagnetic wave signals and to generate a plurality of acoustic wave signals to be transmitted with an acoustic transmission medium, and a plurality of acoustic reflectors communicatively coupled to the acoustic transmission medium. The plurality of acoustic reflectors receive the plurality of acoustic wave signals from the acoustic transmission medium and reflect a plurality of reflected acoustic wave signals to the plurality of piezoelectric transducers using the acoustic transmission medium.

In example 13, the subject matter of example 12 can optionally include an antenna unit to receive an electromagnetic wave from a radio frequency identification (RFID) tag reader and to convert this electromagnetic wave into a guided electromagnetic wave signal for a transmission line.

In example 14, the subject matter of any of examples 12-13 can optionally further include a power splitter and combiner coupled to the plurality of piezoelectric transducers. The power splitter and combiner to split the electromagnetic wave signal received from the antenna unit into multiple electromagnetic wave signals to be transmitted by a plurality of transmission lines to the plurality of piezoelectric transducers.

In example 15, the subject matter of any of examples 12-14 can optionally further include the plurality of piezoelectric transducers to receive the reflected acoustic wave signals that have been reflected from the plurality of acoustic reflectors or have been reflected by one or more disconnected acoustic transmission lines.

In example 16, the subject matter of any of examples 12-15 can optionally further include the plurality of piezoelectric transducers to convert the reflected acoustic wave signals into electromagnetic wave signals to be transmitted to the power splitter and combiner which combines the signals and sends to the antenna unit to be transmitted to the RFID tag reader.

In example 17, the subject matter of any of examples 12-16 can optionally further include the reflected acoustic wave signals representing a code stored in the delay line structure with the code being associated with a RFID tag.

In example 18, the subject matter of any of examples 12-17 can optionally further include the plurality of piezoelectric transducers each comprising a second electrode disposed on a piezoelectric material which is disposed on a first electrode of each piezoelectric transducer.

In example 19, the subject matter of any of examples 12-18 can optionally further include a cavity having a plurality of acoustic transmission lines each having a different length. The plurality of piezoelectric transducers are positioned in proximity to a first end of the cavity and the plurality of acoustic reflectors are positioned in proximity to a second end of the cavity.

In example 20, the subject matter of any of examples 12-19 can optionally further include each acoustic reflector including at least one mechanical anchor and each acoustic reflector being positioned within the cavity or within the organic dielectric material.

In example 21, the subject matter of any of examples 12-20 can optionally further include each acoustic transmission line of the transmission medium comprising at least one of air and a suspended conductive beam.

In example 22, the subject matter of any of examples 12-21 can optionally further include the delay line structure being fabricated at panel level.

Example 23 is a computing device comprising at least one processor to process data and a package substrate coupled to the at least one processor. The package substrate includes organic material and a plurality of conductive layers to form the package substrate which includes a piezoelectric transducer to receive a guided electromagnetic wave signal and to generate an acoustic wave signal to be transmitted with an acoustic transmission medium and an acoustic reflector communicatively coupled to the acoustic transmission medium. The acoustic reflector to receive the acoustic wave signal from the acoustic transmission medium and to reflect a reflected acoustic wave signal to the piezoelectric transducer using the acoustic transmission medium.

In example 24, the subject matter of example 23 can optionally further include an antenna unit to receive an electromagnetic wave from a radio frequency identification (RFID) tag reader and to convert this electromagnetic wave into a guided electromagnetic wave signal for a transmission line for propagating to the piezoelectric transducer.

In example 25, the subject matter of any of examples 23-24 can optionally further include a printed circuit board coupled to the package substrate.

The invention claimed is:

1. A delay line circuitry integrated with an organic substrate comprising:
   organic dielectric material and a plurality of conductive layers to form the organic substrate;
   a piezoelectric transducer to receive a guided electromagnetic wave signal and to generate an acoustic wave signal to be transmitted with an acoustic transmission medium; and
   an acoustic reflector communicatively coupled to the acoustic transmission medium, the acoustic reflector to receive a plurality of acoustic wave signals from the acoustic transmission medium and to reflect acoustic wave signals to the piezoelectric transducer using the acoustic transmission medium.

2. The delay line circuitry of claim 1, further comprising:
   an antenna unit to receive an electromagnetic wave from a radio frequency identification (RFID) tag reader and to convert this electromagnetic wave into the guided electromagnetic wave signal for a transmission line for propagating to the piezoelectric transducer.

3. The delay line circuitry of claim 1, further comprising:
   a power splitter and combiner coupled to the piezoelectric transducer, the power splitter and combiner to split the acoustic wave signal received from the piezoelectric transducer into multiple acoustic wave signals to be transmitted by a plurality of acoustic transmission lines of the acoustic transmission medium to the acoustic reflector.

4. The delay line circuitry of claim 3, wherein the power splitter and combiner to combine reflected acoustic wave signals that have been reflected from the acoustic reflector or have been reflected by one or more disconnected acoustic transmission lines.

5. The delay line circuitry of claim 4, wherein the piezoelectric transducer to receive reflected acoustic wave signals from the power splitter and combiner and to convert the reflected acoustic wave signals into electromagnetic wave signals to be transmitted to the RFID tag reader.

6. The delay line circuitry of claim 5, wherein the reflected acoustic wave signals represent a code stored in the delay line circuitry with the code being associated with a RFID tag.

7. The delay line circuitry of claim 1, wherein the piezoelectric transducer comprises a second electrode disposed on a piezoelectric material which is disposed on a first electrode of the piezoelectric transducer.

8. The delay line circuitry of claim 7, wherein the piezoelectric transducer to generate the acoustic wave signal in response to displacement of the piezoelectric transducer that is caused by the guided electromagnetic wave signal.

9. The delay line circuitry of claim 7, wherein the organic substrate comprises:
   a cavity having a plurality of acoustic transmission lines each having a different length, wherein the piezoelectric transducer is positioned in proximity to a first end of the cavity and the acoustic reflector is positioned in proximity to a second end of the cavity.

10. The delay line circuitry of claim 9, wherein the acoustic reflector includes at least one mechanical anchor and the acoustic reflector is positioned within the cavity or within the organic dielectric material.

11. The delay line circuitry of claim 9, wherein the transmission medium comprises at least one of air and a suspended conductive beam.

12. The delay line circuitry of claim 9, wherein the organic substrate is fabricated at panel level.

13. A delay line structure comprising:
   organic dielectric material and a plurality of conductive layers to form the delay line structure;
   a plurality of piezoelectric transducers to receive a plurality of guided electromagnetic wave signals and to generate a plurality of acoustic wave signals to be transmitted with an acoustic transmission medium; and
   a plurality of acoustic reflectors communicatively coupled to the acoustic transmission medium, the plurality of acoustic reflectors to receive the plurality of acoustic wave signals from the acoustic transmission medium and to reflect a plurality of reflected acoustic wave signals to the plurality of piezoelectric transducers using the acoustic transmission medium.

14. The delay line structure of claim 13, further comprising:
   an antenna unit to receive an electromagnetic wave from a radio frequency identification (RFID) tag reader and to convert this electromagnetic wave into a guided electromagnetic wave signal for a transmission line.

15. The delay line structure of claim 14, further comprising:
   a power splitter and combiner coupled to the plurality of piezoelectric transducers, the power splitter and combiner to split the electromagnetic wave signal received from the antenna unit into multiple electromagnetic wave signals to be transmitted by a plurality of transmission lines to the plurality of piezoelectric transducers.

16. The delay line structure of claim 15, wherein the plurality of piezoelectric transducers to receive the reflected acoustic wave signals that have been reflected from the plurality of acoustic reflectors or have been reflected by one or more disconnected acoustic transmission lines.

17. The delay line structure of claim 16, wherein the plurality of piezoelectric transducers to convert the reflected acoustic wave signals into electromagnetic wave signals to be transmitted to the power splitter and combiner which combines the signals and sends to the antenna unit to be transmitted to the RFID tag reader.

18. The delay line structure of claim 17, wherein the reflected acoustic wave signals represent a code stored in the delay line structure with the code being associated with a RFID tag.

19. The delay line structure of claim 13, wherein the plurality of piezoelectric transducers each comprise a second electrode disposed on a piezoelectric material which is disposed on a first electrode of each piezoelectric transducer.

20. The delay line structure of claim 13, further comprising:
   a cavity having a plurality of acoustic transmission lines each having a different length, wherein the plurality of piezoelectric transducers are positioned in proximity to a first end of the cavity and the plurality of acoustic reflectors are positioned in proximity to a second end of the cavity.

21. The delay line structure of claim 20, wherein each acoustic reflector includes at least one mechanical anchor and each acoustic reflector is positioned within the cavity or within the organic dielectric material.

22. The delay line structure of claim 13, wherein each acoustic transmission line of the transmission medium comprises at least one of air and a suspended conductive beam.

23. The delay line structure of claim 13, wherein the delay line structure is fabricated at panel level.

24. A computing device comprising:
- at least one processor to process data;
- a package substrate coupled to the at least one processor, the package substrate includes organic material and a plurality of conductive layers to form the package substrate which includes a piezoelectric transducer to receive a guided electromagnetic wave signal and to generate an acoustic wave signal to be transmitted with an acoustic transmission medium and an acoustic reflector communicatively coupled to the acoustic transmission medium, the acoustic reflector to receive the acoustic wave signal from the acoustic transmission medium and to reflect a reflected acoustic wave signal to the piezoelectric transducer using the acoustic transmission medium.

25. The computing device of claim 24, further comprising:
- an antenna unit to receive an electromagnetic wave from a radio frequency identification (RFID) tag reader and to convert this electromagnetic wave into a guided electromagnetic wave signal for a transmission line for propagating to the piezoelectric transducer.

26. The computing device of claim 24, further comprising:
- a printed circuit board coupled to the package substrate.

* * * * *